United States Patent [19]

Goetschi

[11] Patent Number: 4,493,541
[45] Date of Patent: Jan. 15, 1985

[54] APPARATUS FOR PHOTOGRAPHICALLY PRODUCING CHARACTERS OR OTHER REPRESENTATIONS

[76] Inventor: Fred A. Goetschi, Haus zum Anker, CH-6354 Vitznau, Switzerland

[21] Appl. No.: 499,082

[22] Filed: May 27, 1983

Related U.S. Application Data

[62] Division of Ser. No. 245,516, Mar. 19, 1981, Pat. No. 4,409,305.

[30] Foreign Application Priority Data

Sep. 23, 1980 [EP] European Pat. Off. ............ 105701.9

[51] Int. Cl.³ ........................ G03B 27/04; G03D 5/00
[52] U.S. Cl. ........................ 354/5; 354/297; 355/113
[58] Field of Search ............... 354/5, 12, 14, 17, 297; 355/79, 99, 132, 100, 113; 430/22, 141, 143, 394

[56] References Cited

U.S. PATENT DOCUMENTS

| | | | |
|---|---|---|---|
| 2,883,918 | 5/1959 | Mosteller | 354/17 |
| 3,527,604 | 9/1970 | Endermann | 430/143 |
| 3,552,284 | 1/1971 | Noble et al. | 354/14 |
| 3,667,356 | 6/1972 | Noble | 354/14 |
| 3,734,725 | 5/1973 | Bailey | 430/22 |
| 3,881,821 | 5/1975 | White | 354/5 |
| 4,094,680 | 6/1978 | Frazier | 430/394 |
| 4,257,696 | 3/1981 | Kronmam et al. | 354/14 |
| 4,266,863 | 5/1981 | Hollingsworth | 354/12 |
| 4,282,300 | 8/1981 | Wegener | 430/141 |

FOREIGN PATENT DOCUMENTS 1145490 2/1962 Fed. Rep. of Germany .
2146138 9/1971 Fed. Rep. of Germany .

Primary Examiner—A. A. Mathews
Attorney, Agent, or Firm—Barnes, Kisselle, Raisch, Choate, Whittemore & Hulbert

[57] ABSTRACT

A light box is for supporting a stack of essentially transparent sheets including photo material which is insensitive to daylight and sensitive to shortwave light, and a record carrier film having transparent regions in the form of the characters or other representations to be produced and an opaque background to shortwave light. The illumination by the light box facilitates positioning of the record carrier film relatively to the photo material, and a grid can be a further help in positioning. A flash device having an aperture, the size of which corresponds to the size of the character or other representation, is for producing the shortwave light to blacken the photo material corresponding to the selected record on the record carrier film.

23 Claims, 2 Drawing Figures

U.S. Patent   Jan. 15, 1985   4,493,541
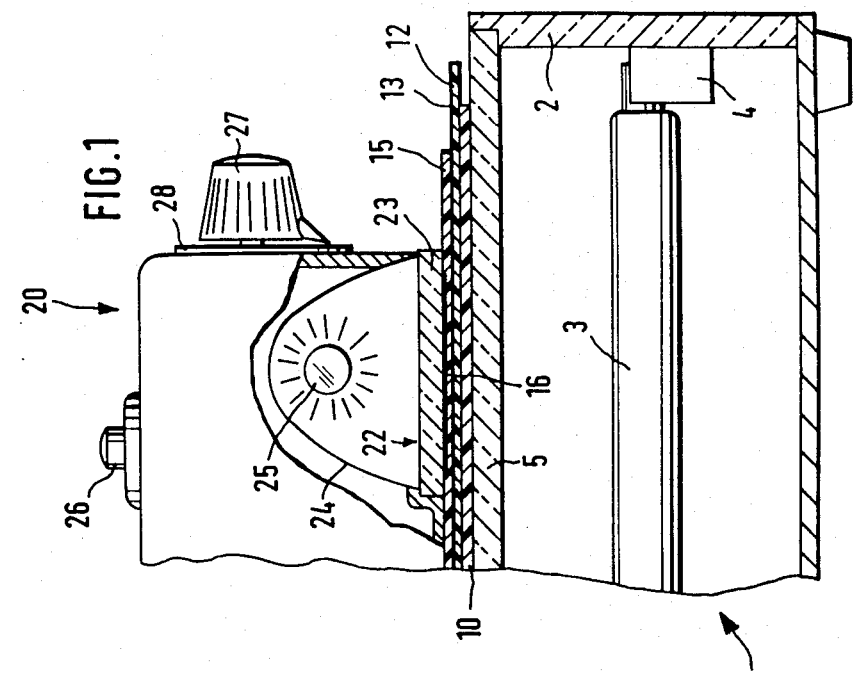
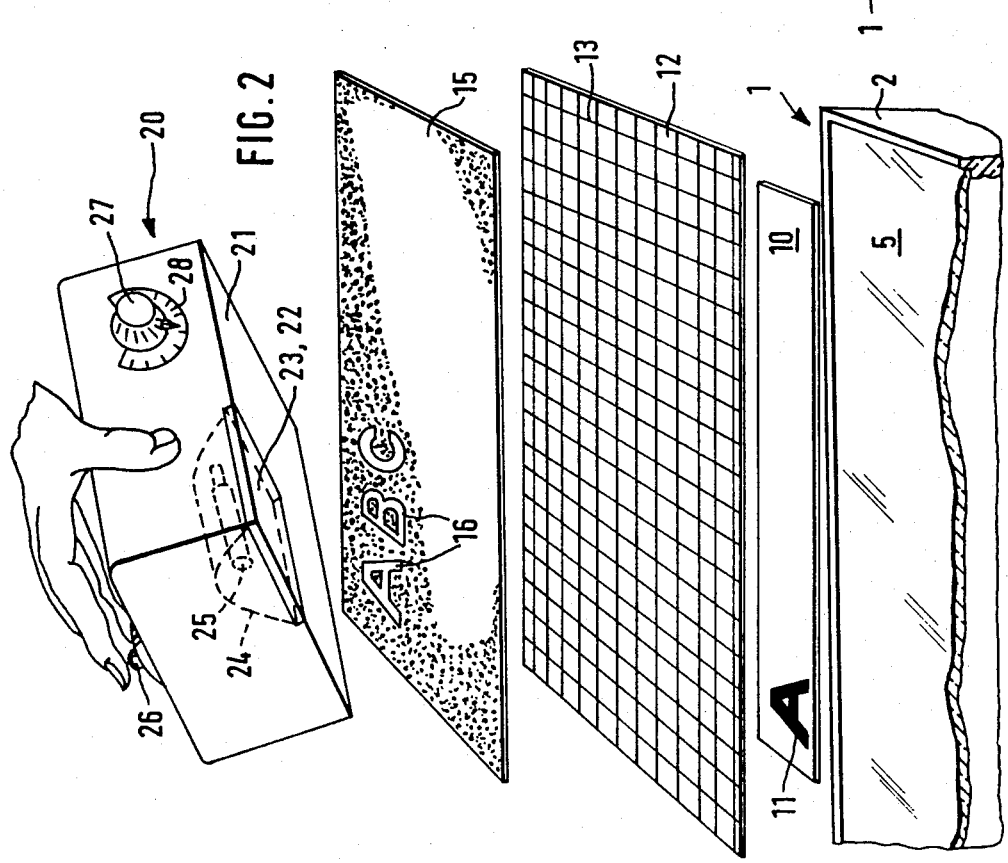

APPARATUS FOR PHOTOGRAPHICALLY PRODUCING CHARACTERS OR OTHER REPRESENTATIONS

This application is a division of my co-pending application Ser. No. 06/245,516 filed Mar. 19, 1981 titled METHOD FOR PRODUCING CHARACTERS AND OTHER REPRESENTATION, IN PARTICULAR TITLE SET, ON A PHOTO MATERIAL, now U.S. Pat. No. 4,409,305 issued Oct. 11, 1983 and claiming the priority under 35 U.S.C. § 120 of my European application No. 80 105 701.9 filed Sept. 23, 1980.

The invention relates to an apparatus for photographically producing characters or other representations under daylight conditions, such as title set, utilizing photomaterial in sheet form which is generally insensitive with respect to daylight or blue light and having a predetermined sensitivity with respect to short-wave light, in conjunction with a suitable developer liquid.

BACKGROUND AND SUMMARY OF THE INVENTION

When producing characters or other representations such a title set by photographic printing, a projecting device is used for projecting these characters onto photographic material wetted developer. It is already known to use photographic material having a steep gradation and a generally low sensitivity (German Auslegeschrift No. 1,145,490), however, this method was not generally adopted though it can be carried out in daylight conditions.

More in use are devices utilized in dark rooms wherein in operation of photographic lettering is carried out under red light, while the exposure of the photomaterial is effected with white light.

Photographic printing apparatus to be used under daylight conditions are also known which have light-tight regions wherein the photomaterial and the exposed character are included. An example thereof is U.S. Pat. No. 2,883,918 to W. P. Mosteller showing a sheet of opaque material having photosensitive material secured to undersurface thereof and being in contact with negative printing character sheet which can be exposed by light which is projected upwardly through an opening in the table top. In order to make visible what is printed, a character index sheet which is coupled to the negative printing character sheet and a layout sheet coupled to the photomaterial are provided to be moved relatively to one another and in synchronism to the sheet to which they are coupled. A further projecting device is for illuminating a spot which corresponds to the exposed spot though that a corresponding positive letter is illuminated which just can be produced by the apparatus on the photomaterial. This known photographic lettering device is expensive and the operation is complicated.

It is an object of the invention to provide an apparatus for photographically producing characters which is simple in its design.

A further object of the invention is to create an apparatus for photographically producing characters which can easily be operated.

In accordance with the invention, the apparatus for photographically producing characters or other representations comprises a light box for supporting photomaterial and other sheets and illuminating same with non-actinic light, a record carrier film having transparent regions in the form of the characters and an opaque background to shortwave light, and a flash device for producing shortwave light on those spots where the characters are to be produced. Since the characters or other representation appear immediately after exposure by shortwave light, the characters can be produced in context and without interruption by developing steps being carried out separately.

The photomaterial needed which is insensitive to daylight and sensitive to shortwave light is available to low costs and has to be wetted by developer liquid and covered with a protecting sheet. It is also possible to prepare such covered and protected photomaterial to be sold for the purposes of invention.

The light box has a light source for non-nactinic light, that is to say which does not blacken the photomaterial. Light in the visible region is such non-actinic light. Preferably yellow light is used which has a good contrast to the red or sepia coloured background of the record carrier film yet having a component which penetrates through that background.

The record carrier film preferably is a negative film which is transparent for the characters or other representations, whereas the background is distinctive to the characters and opaque for shortwave light.

The flash device has the usual tubular discharge lamp which will produce shortwave light. An aperture is provided to narrow the light flow onto a spot corresponding to size of a character or other representation to be produced.

In order to facilitate positioning of the record carrier film, a grid can be used wherein the characters already produced and the respective character to be produced appear. The light source of the light box will illuminate this grid which is visible through transparent sheets on the light box.

DESCRIPTION OF THE DRAWINGS

FIG. 1 is partly a vertical cross section through the light box - portions being broken-away - and partly a view on a flash device, also portions being broken-away, and FIG. 2 is an exploded perspective view of the components shown in FIG. 1.

DESCRIPTION

The apparatus according to the invention, for the production of characters and other representations, in particular title set, on a photo material, essentially includes the following components and materials:

A light box 1 for producing non-actinic light and serving as a support means, an insensitive photo material 10 in sheet form being moistened with developer liquid and covered by a transparent cover film 12, a record carrier film 15 showing characters, symbols, pictures, photos or the like representations to be produced, and a portable flash device 20.

The light box 1 comprises a light-tight casing which contains a fluorescent tube 3 in a holder 4 and is covered by a transparent support plate 5. The tube 3 delivers non-actinic light, particularly yellow light, which penetrates the plate 5 and is preferably diffused. To that purpose, the plate 5 is made up of glass having roughened surfaces by etching. The tube 3 is supplied with power by way of a cable (not shown). Support plate 5 may be tinted yellow to produce the preferred yellow light.

The photo material 10 is insensitive in the visible light range, and sensitive with respect to shortwave light.

The transparent cover film 12 comprises material which is non-transmissive in respect of developer liquid, and has a line grid (millimeter grid) 13 printed on which is blue-tinted.

The record carrier film 15 is transparent for visible light, yet has a background which is opaque for shortwave light and is orange or sepia coloured in visible light, with the exception of "negative" regions in the form of characters 16 which are clear transparent. The background portions may comprise diazo film. The characters 16 which are disposed on the film 15 in negative form may be letters, numerals, symbols, graphic representations, photos or the like.

The flash device 20 has an underside 21 with an opening or aperture 22 therein which is covered by a glass plate 23. The size of the aperture 22 is sufficient to cover each character 16. Alternatively, the size of the aperture 22 may be made variable, by diaphragm or shutter means, to be adapted to the size of the character just produced. The flash device 20 furthermore includes a reflector 24, a flash lamp 25 and a trigger button 26 and can be of a kind which has an incorporated power source (not shown). The flash device 20 should be capable of producing a large number of flashes of equal intensity, in quick succession. The flash device 20 may also be of a kind to vary the intensity or number of flashes produced in a cycle. Such a device 20 has an adjusting knob 27 and a pointer which is rotatable relative to a scale 28 showing the total light quantity in a flash cycle for producing a character.

In any case, the flash device 20 is of a kind to show the perimeter of the aperture 22 to an operator. As shown in FIG. 2, the glass plate 23 (which also serves as a pressure plate) adjoins two outside edges of the flash device 20. This arrangement substantially facilitates positioning the aperture 22 over the character 16 to be produced.

The operation is as follows:

Photomaterial 10 which is wetted by developer liquid and covered by the film 12 is laid upon the light box 1. The record carrier film 15 is juxtaposed yet illuminated from below and positioned so that the selected character 16 is on the desired position. The line grid 13 also illuminated from below facilitates this positioning. The flash device 20 with its aperture 22 is pressed on the "negative" character 16 and a number of flashes are produced. The photo material becomes blackened according to that irritated character 16. The grid 13 is transmissive for shortwave light and, therefore, will not appear on the photo material. A new character 16 will be selected and produced as described. The operation is repeated until the title set or the like is completed.

The grid 13 can also be provided on the support plate 5 of the light box. In this case transparent or translucent photomaterial 10 is used.

I claim:

1. Apparatus for photographically producing characters or other representations under daylight conditions, such as title set, comprising photo material in sheet form which is generally insensitive with respect to daylight including blue light and having a predetermined sensitivity with respect to shortwave light, a source of shortwave light, a developer liquid suitable for said photo material, a transparent cover film which is non-transmissive with respect to said developer liquid and a record carrier film which has at least one transparent region in the form of a character, symbol, picture, photo or other like representation surrounded by a ground which is opaque with respect to shortwave light to thereby provide a photostenciling implement, characterized by said photo material being wetted with said developing liquid and covered with said transparent cover film, of said record carrier film being relatively positioned on said cover film on the side thereof opposite to said photo material and such that said one transparent region is juxtaposed to where its projected image is to be produced on said photo material, said shortwave light source being positioned for irradiating said one transparent region with shortwave light so as to activate the photo material in the area juxtaposed to said one transparent region to thereby produce a corresponding image on the photo material which becomes immediately visible to the naked eye in daylight conditions.

2. The apparatus as set forth in claim 1 wherein said transparent cover film has a line grid thereon which is blue tinted, wherein said ground of said record carrier film is a color selected from the group consisting of orange or sepia and said record carrier film is a diazo film.

3. Apparatus for use in the photographic production of characters or the like, according to a method of photographically producing characters or other representations under daylight conditions, in particular title set, on photo material, comprising, in combination:
    (a) a sheet of photo material (10) of the type which is insensitive with respect to daylight and sufficiently sensitive with respect to short-wave light;
    (b) a wetting developer liquid absorbed on at least one side of said photo material;
    (c) a transparent cover film (12) disposed adjacent said one side of said photo material to protect the same from evaporation of said developer liquid;
    (d) a recording carrier film (15) having transparent regions (16) on a coloured ground which is opaque with respect to short-wave light disposed adjacent said cover film on the side thereof remote from said photo material in a suitable position relative to said photo material, with a selected one of said transparent regions, which are in the form of characters or the like, aligned with a selected area of said photo material; and
    (e) a flash device (20) having a transparent flat pressure plate (23) in front of its light aperture and including means (25) operable to produce shortwave light flashes for irradiating the selected transparent region of the recording carrier film, said flash device being manually positionable adjacent said carrier film with said plate disposed thereagainst for exposure of said photo material with short-wave light transmitted through a selected one of said transparent regions of said carrier film to form a corresponding image on the photo material which becomes rapidly visible to the naked eye immediately following said exposure by said flash device.

4. Apparatus according to claim 3 further including in combination a light box (1) having a light source for producing visible light which is non-actinic relative to said photo material and having a flat support plate (5) juxtaposed to said light source, said photo material being disposed in supported relation on said support plate on the side thereof remote from said light source and with the side of the photo material remote from said cover film facing said support plate, whereby said light box light source illuminates the juxtaposed array of said photo material, cover film and carrier film to facilitate the operations of aligning regions of the carrier film with selected areas of said photo material.

5. Apparatus according to claim 3 characterised in that the transparent pressure plate (23) is a glass plate which covers the light aperture (22) of the flash device (20).

6. Apparatus according to claim 3 characterised in that the portable flash device (20) has a flat underside (21) and the transparent pressure plate (23), in the region of the light aperture (22), forms a portion of said flat underside, which portion is in the same surface plane.

7. Apparatus according to claim 3 characterised in that the transparent pressure plate (23) terminates flush at its outside with at least one and preferably two adjoining outside walls of the flash device (20).

8. Apparatus according to claim 4 characterised in that the light box (1) produces coloured light which at least partially passes through the coloured ground of the recording carrier film (15).

9. Apparatus according to claim 4 characterised in that the support plate (5) is tinted yellow.

10. Apparatus according to claim 4 characterised in that the surface of the support plate (5) is roughened so that the light issues from the light box (1) in a diffuse condition.

11.
Apparatus for photographically producing characters and other representations under daylight conditions, such as title set, comprising, in combination, photo material in sheet form which is generally insensitive with respect to daylight including blue light and having a predetermined sensitivity with respect to short-wave light, in conjunction with a suitable developer liquid, a light box, said light box having a light source for producing visible light which is non-actinic relative to said photo material and a support plate supporting said photo material and transmissive for at least some of said visible light to illuminate said photo material, a record carrier film positioned above said photo material, said record carrier film having a background which is opaque to said short-wave light and light transmissive for at least some of said non-actinic light, and transparent regions in the form of said characters or other representations to be produced, and a flash device to be positioned above said character or other representations to be produced, said flash device having a light source for producing said short-wave light and an aperture to be directed on said character or other representation to be produced from said record carrier film.

12.
Apparatus according to claim 11 wherein said light source and said transparent support plate of said light box cooperate to project yellow light through said superposed photo material and said record carrier film.

13. Apparatus according to claim 11 wherein said transparent support plate of said light box is translucent to diffuse said non-actinic light of said light box.

14. Apparatus according to claim 11 wherein said background of said record carrier film is coloured.

15. Apparatus according to claim 14 wherein said colour of said background is selected from the group consisting of orange or sepia colour.

16. Apparatus according to claim 11 wherein said background of said record carrier film comprises diazo film.

17.
Apparatus according to claim 11 wherein said aperture of said flash device has a size corresponding to the size of said character or other representation to be produced.

18. Apparatus according to claim 11 further comprising a cover film disposed between said photo material and said record carrier film 19. Apparatus according to claim 11 further comprising a grid positioned between said non-actinic light source of said light box and said record carrier film, said grid being visible in said non-actinic light through said carrier film.

20. Apparatus in kit form adapted to be assembled and used for performing a method of photographically producing characters and other representations under daylight conditions, such as title set, said apparatus including in combination, photo material in sheet form which is generally insensitive with respect to daylight including blue light and having a predetermined sensitivity with respect to short-wave light, a suitable developer liquid for pre-wetting said photo material, a light box, said light box having a light source for producing visible light which is non-actinic relative to said photo material and a support plate supporting said photo material and transmissive for at least some of said visible light to illuminate said photo material, a transparent cover film which is non-transmissive with respect to said developer liquid and positionable over said developer pre-wetted photo material, a record carrier film positionable over said cover film, said record carrier film having a background which is opaque to said short-wave light and light transmissive for at least some of said non-actinic light, and transparent regions in the form of said characters or other representations to be produced, and a flash device adapted to be manually positioned above said character or other representations to be produced, said flash device having a light source for producing said short-wave light and an aperture to be directed on said character or other representation to be produced from said record carrier, said apparatus being especially adapted for manually performing the following method:

(a) placing said photo material onto said light box and illuminating the same with said light source, (b) wetting said photo material with said developing liquid, (c) covering said wetted photo material with said transparent cover film, (d) relatively positioning said record carrier film and said transparent cover film such that said one transparent region is juxtaposed to where its projected image is to be produced on said photo material, (e) irradiating said one transparent region with short-wave light so as to activate the photo material in the area juxtaposed to said one transparent region to thereby provide a corresponding image on the photo material which becomes immediately visible to the naked eye in daylight conditions.

21. Apparatus in kit form for photographically producing characters or other representations under daylight conditions, such as title set, comprising photo material in sheet form which is generally insensitive with respect to daylight including blue light and having a predetermined sensitivity with respect to short-wave light, a source of short-wave light, a developer liquid suitable for said photo material, a transparent cover film which is non-transmissive with respect to said developer liquid and a record carrier film which has at least one transparent region in the form of a character, symbol, picture, photo or other like representation surrounded by a ground which is opaque with respect to short-wave light to thereby provide a photostenciling implement, said photo material being adapted to be wetted with said developing liquid and then covered with said transparent cover film, said record carrier film being relatively positionable on said cover film on the side thereof opposite to said photo material and such that said one transparent region is juxtaposed to where its projected image is to be produced on said photo material, said short-wave light source being manually positionable for irradiating said one transparent region with short-wave light so as to activate the photo material in the area juxtaposed to said one transparent region to thereby produce a corresponding image on the photo material which becomes immediately visible to the naked eye in daylight conditions.

22. The apparatus as set forth in claim 21 wherein said transparent cover film has a line grid thereon which is blue tinted, wherein said ground of said record carrier film is a color selected from the group consisting of orange or sepia and said record carrier film is a diazo film.

23. Device for photographically producing characters, especially for caption, on photographic material (10) which is wetted with developing liquid and allows processing under subdued daylight, characterized in that, for observing purposes, a light box (1) is provided comprising a light source (3) for non-actinic light and a flat support plate (5) for the photographic material (10) and a record carrier film (15) having characters (16) and coloured regions, that the material of the record carrier film (15) is selected so as its coloured regions are transparent for the light of the light source (3) at least partially, and that a flash device (20) having a short-wave light source (25) is provided for positioning above the support plate (5) for exposing the photographic material (10) with short-wave light, said flash device having an an aperture (22) corresponding approximately to the size of a character (16).

* * * * *